United States Patent [19]
Yoshimura

[11] Patent Number: 5,532,656
[45] Date of Patent: Jul. 2, 1996

[54] PLANAR T-TYPE LC FILTER WITH RECESSES BETWEEN TERMINAL ELECTRODES

[75] Inventor: Tamotsu Yoshimura, Kyoto, Japan

[73] Assignee: Rohm Co., Ltd., Kyoto, Japan

[21] Appl. No.: 365,406

[22] Filed: Dec. 28, 1994

[30] Foreign Application Priority Data

Dec. 28, 1993 [JP] Japan .................... 5-336022

[51] Int. Cl.⁶ ...................... H03H 7/01
[52] U.S. Cl. ...................... 333/185; 336/200
[58] Field of Search ............... 333/167, 175, 333/181, 185, 204; 336/200

[56] References Cited

U.S. PATENT DOCUMENTS

| | | | |
|---|---|---|---|
| 4,573,101 | 2/1986 | Takeno | 333/185 X |
| 4,626,816 | 12/1986 | Blumkin et al. | 336/200 X |
| 4,888,568 | 12/1989 | Kawaguchi | 333/185 X |
| 5,015,975 | 5/1991 | Okubo | 333/181 |
| 5,034,710 | 7/1991 | Kawaguchi | 333/185 |
| 5,105,172 | 4/1992 | Khatibzadeh et al. | 333/175 |
| 5,291,375 | 3/1994 | Mukai | 361/760 |
| 5,307,045 | 4/1994 | Senda et al. | 336/200 |

FOREIGN PATENT DOCUMENTS

4-23321  2/1992  Japan .

*Primary Examiner*—Benny Lee
*Assistant Examiner*—Justin P. Bettendorf
*Attorney, Agent, or Firm*—Nikaido, Marmelstein, Murray & Oram

[57] ABSTRACT

Two coil devices are formed by forming two winding conductors on an insulating substrate by printing. A capacitor device is formed on the insulating substrate by printing a conductor, a dielectric substance and a conductor in this order. An end of each coil device is connected to a terminal of the capacitor device to form a small chip LC filter for high frequency band.

5 Claims, 8 Drawing Sheets

PLANAR T-TYPE LC FILTER WITH RECESSES BETWEEN TERMINAL ELECTRODES

BACKGROUND OF THE INVENTION

1. Field of the Invention

The present invention relates to a filter used as a noise preventing part of a digital signal processing circuit for use in an office automation apparatus, a television receiver and a video apparatus.

2. Description of the Prior Art

Figure 9:
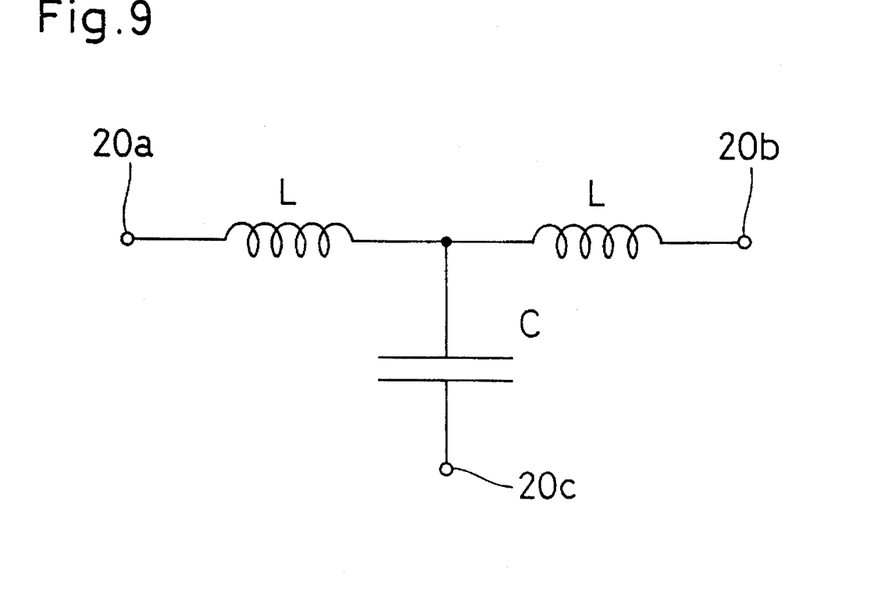
FIG. 9 is a circuit diagram of an equivalent circuit of a T LC filter circuit of the first embodiment.

To prevent noise in a digital signal processing circuit, a T-LC type inductor-capacitor (LC) filter having an equivalent circuit shown in FIG. 9 is widely used. Conventionally, the filter circuit is generally composed of discrete parts such as a capacitor and a coil. As a filter of this type, for example a filter of a structure shown in FIG. 1 has been proposed. To form the filter part, one end of each of molded coils 21a and 21b, each made by pressing a lead frame into a coil is connected to electrode terminals 22a and 22b, respectively, and after the other end of each of the molded coils 21a and 21b is connected to one terminal of a chip capacitor 23 of an appropriate capacitance, the whole part is covered with a magnetic sheathing substance 25. A filter part using a winding coil 24 shown in FIG. 2 has been proposed. This filter part is the same as the above-described filter part in that it is covered with the magnetic sheathing substance after a plurality of single parts are mounted.

Figure 1:
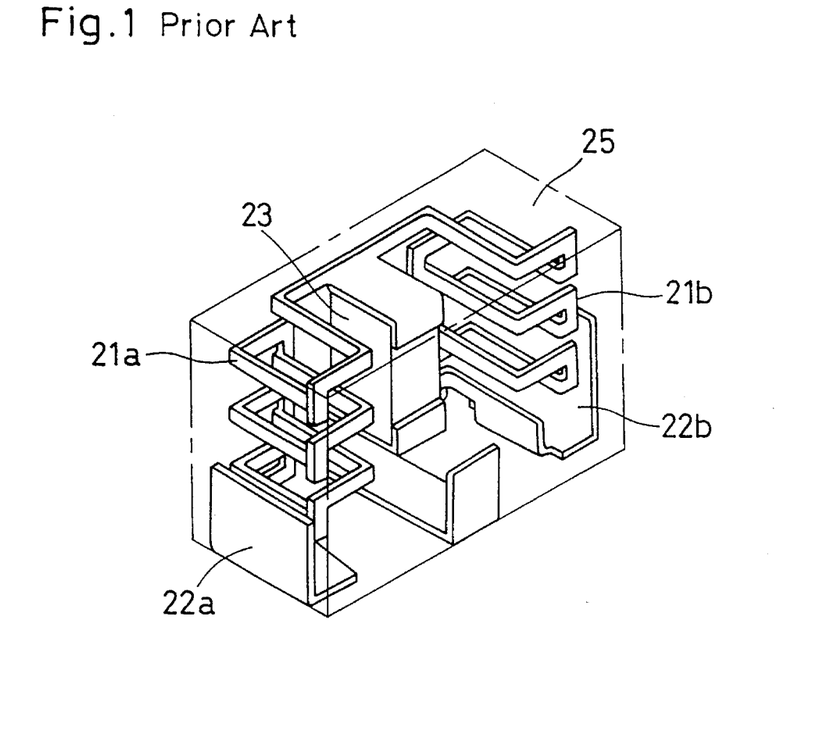
FIG. 1 is a perspective view of a conventional filter part using molded coils.
Figure 2:
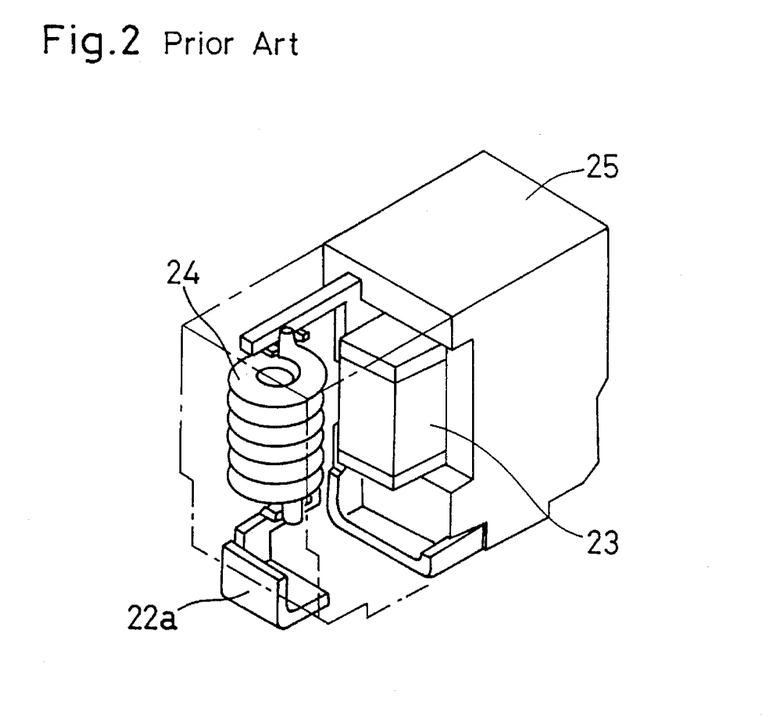
FIG. 2 is a perspective view of a conventional filter part using winding coils.

The overall sizes of the filter parts shown in FIGS. 1 and 2 depend on the sizes of the coils. However, it is difficult to mold a minute coil and to form a small winding coil, and it is difficult to reduce the size of the filter formed by covering these coils with the magnetic sheathing substance. It is particularly difficult to reduce the thickness. This prevents the improvement of the packaging density. Further, since a plurality of discrete parts are mounted, the gap among the parts increases, so that the electrical loss of alternating currents in the high-frequency band increases.

A noise filter the making of which is simplified by forming a coil and a capacitor on an insulating substrate by thick film printing and using the electrode pattern of the coil also as the electrode pattern of the capacitor is disclosed in Japanese Laid-open Utility Model Application H4-23321.

In this noise filter, however, since the electrode pattern of the coil is also used as the electrode pattern of the capacitor, the capacitance of the capacitor naturally depends on the inductance of the coil. As a result, the capacitance of the capacitor and the inductance of the coil cannot separately be set.

On the other hand, by simply forming a winding coil on the insulating substrate, an inductance sufficient for a filter circuit cannot be obtained.

SUMMARY OF THE INVENTION

An object of the present invention is to provide a chip filter part which has a sufficient inductance in the high-frequency band, in which the inductance of the coil and the capacitance of the capacitor can separately be set, the size of which is reduced and which has an excellent packaging capability.

To achieve the above-mentioned object, in a chip filter of the present invention, a capacitor and two substantially winding coils are formed on an insulating substrate by printing, and three terminal electrodes are provided at an end of the insulating substrate. One end of each coil and a first electrode of the capacitor are connected to different terminal electrodes, and another end of each coil is connected to a second electrode of the capacitor.

Generally, a conductor formed into a winding has a small inductance as a coil, so that an inductance sufficient for a filter circuit cannot be obtained. However, when a filter circuit is formed which uses one of the two terminals 20a and 20b of an equivalent circuit of FIG. 9 as an input and the other as an output, a resonance frequency f is $$f = \frac{1}{2\pi\sqrt{LC}}$$

so that the circuit can function as a filter circuit in the high frequency band even if the inductance of the coil is small.

The winding conductor and the dielectric substance of the capacitor can be formed by the thick film printing on the insulating substrate, so that a small-size chip filter is realized according to the above-mentioned features.

The chip filter may be of a structure where in addition to the above-mentioned features, a resistor is formed on the insulating substrate by printing, and a fourth terminal electrode is provided at an end of the insulating substrate to connect the resistor with the second electrode of the capacitor and the fourth terminal electrode. In this case, the flow of noise into the filter circuit is reduced, so that the stability of the filter circuit improves.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

FIGS. 3 to 8 show a making process of a chip filter part according to a first embodiment of the present invention. The features of the chip filter will be disclosed by describing the making process with reference to the figures.

Figure 3:
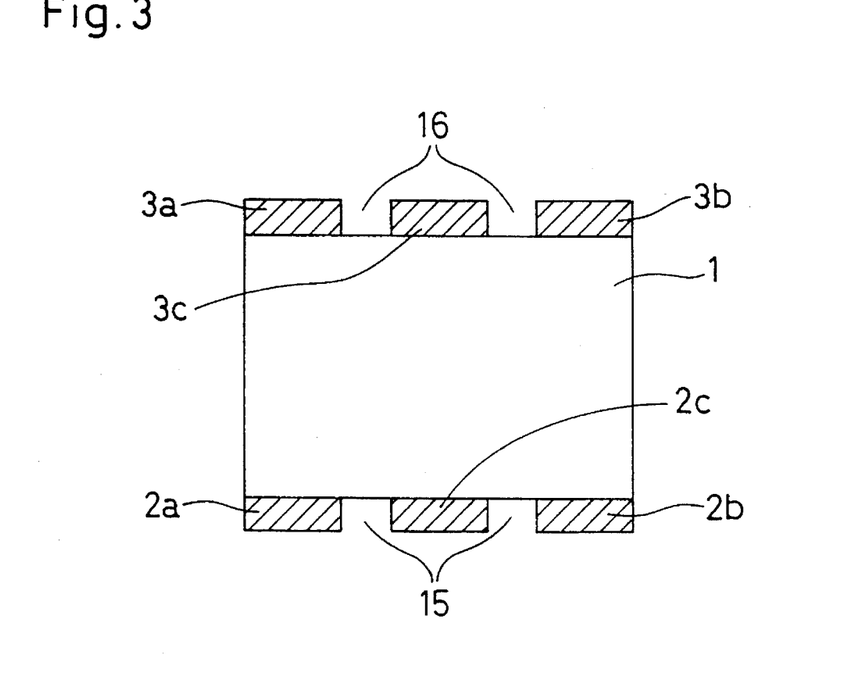
FIG. 3 is a plan view of an insulating substrate on which terminal electrodes have been formed in a chip filter of a first embodiment of the present invention.

Referring to FIG. 3, there is shown an insulating substrate on which terminal electrodes have been formed. The insulating substrate 1 made of an insulating material such as ceramics is a plate having a smooth upper surface. At the two opposing ends, two recesses 15 and 16 of the same size are formed, respectively. In FIG. 3, the two recesses 15 at one end are located at the same distance from the center in the horizontal direction of the insulating substrate 1, and the two recesses 16 at the other end are located opposite to the recesses 15.

On the upper surfaces of the three parts of the end separated from one another by the recesses 15, terminal electrodes 2a, 2b and 2c are formed by printing and burning a conductive paste such as silver paste. Thus, by separating the terminal electrodes 2a, 2b and 2c from one another by the recesses 15, the short circuit between the electrodes is surely prevented at the time of packaging. On the upper surfaces of the three parts separated by the recesses 16, dummy terminal electrodes 3a, 3b and 3c are formed by a similar method. The dummy terminal electrodes 3a, 3b and 3c are provided not for connection to the circuit constituting the chip filter but for obtaining a stability at the time of packaging. As the conductive paste, metal organic gold paste or lead paste may be used instead of silver paste.

Figure 4:
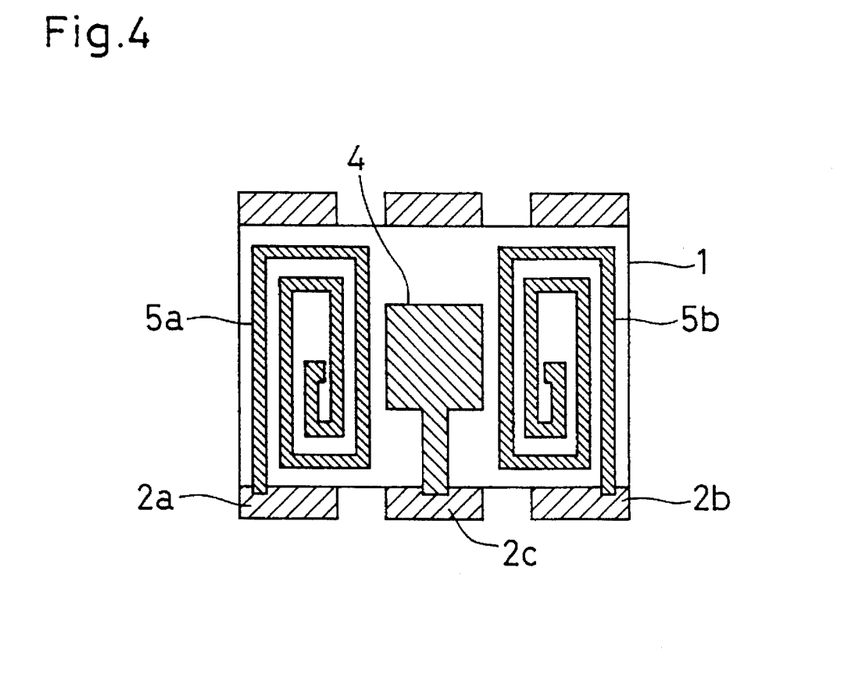
FIG. 4 is a plan view of the insulating substrate on which winding coils and a bottom electrode of a capacitor have been formed in the first embodiment.

By printing a conductive paste on the insulating substrate 1 on which the terminal electrodes have been formed as described above and burning the conductive paste, a bottom electrode (first electrode) 4 of the capacitor and two winding coils 5a and 5b are formed as shown in FIG. 4. The bottom electrode 4 is arranged in the center of the insulating substrate 1 and connected to the terminal electrode 2c. The two winding coils 5a and 5b are arranged on the left and right sides of the bottom electrode 4 and connected to the terminals 2a and 2b, respectively, at one ends. By using the screen process printing, the distance between the conductors can be reduced to approximately 40 μm.

Figure 5:
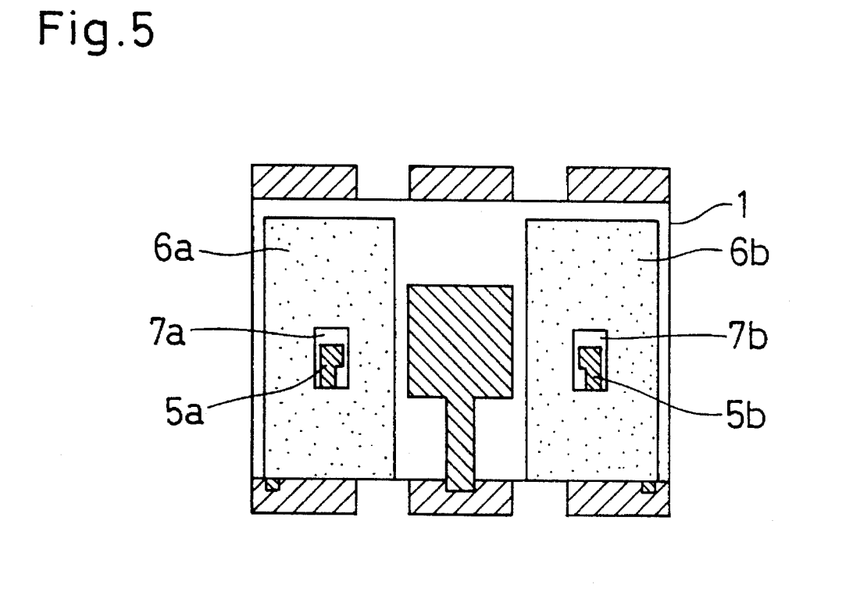
FIG. 5 is a plan view of the insulating substrate on which first glass coats have been formed on the winding coils in the first embodiment.

Then, as shown in FIG. 5, first glass coats 6a and 6b are applied as an insulating member to cover the winding coils 5a and 5b. The glass coats 6a and 6b are formed by printing and burning glass paste. At this time, in order that the ends of the winding coils 5a and 5b in the center thereof are exposed, windows 7a and 7b are formed in the centers of the glass coats 6a and 6b, respectively. The inductances of the winding coils 5a and 5b can be increased by mixing a magnetic substance such as ferrite in the glass paste.

Figure 6:
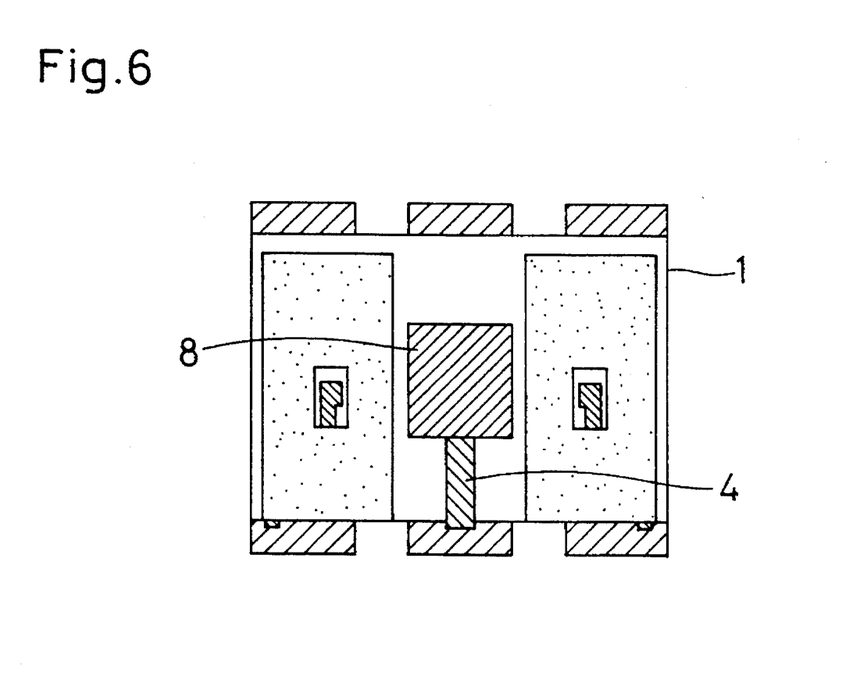
FIG. 6 is a plan view of the insulating substrate on which a dielectric substance has been formed on the bottom electrode of the capacitor in the first embodiment.

After the glass coats 6a and 6b are formed, as shown in FIG. 6, a dielectric substance 8 is provided on the upper surface of the bottom electrode 4 of the capacitor. The dielectric substance 8 is formed by printing a paste including, for example, a perovskite dielectric substance made of $Pb(Mn_xNb_y)$ and burning the paste.

Figure 7:
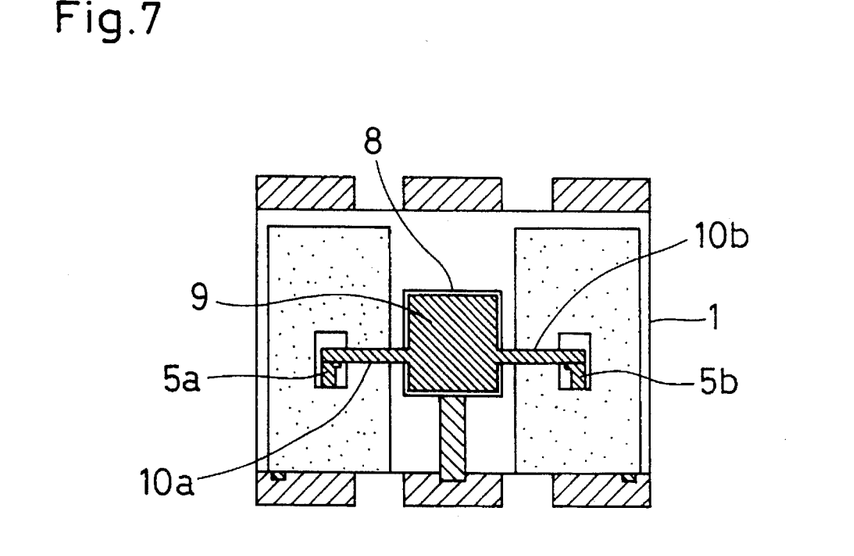
FIG. 7 is a plan view of the insulating substrate on which an upper electrode of the capacitor and connecting conductors for connecting the capacitor with the coils have been formed in the first embodiment.

Then, as shown in FIG. 7, an upper electrode (second electrode) 9 of the capacitor and connecting conductors 10a and 10b for connecting the capacitor with the two winding coils 5a and 5b are formed. To form the upper electrode 9 and the connecting conductors 10a and 10b, a conductive paste is printed so as to cover substantially the entire area of the upper surface of the dielectric substance 8 and to connect the dielectric substance 8 with the ends of the winding coils 5a and 5b exposed at the windows 7a and 7b, and the conductive paste is burnt. Thus, a capacitor device is formed and the capacitor is connected to the winding coils 5a and 5b to form a T-LC type inductor-capacitor (LC) filter circuit.

Figure 8:
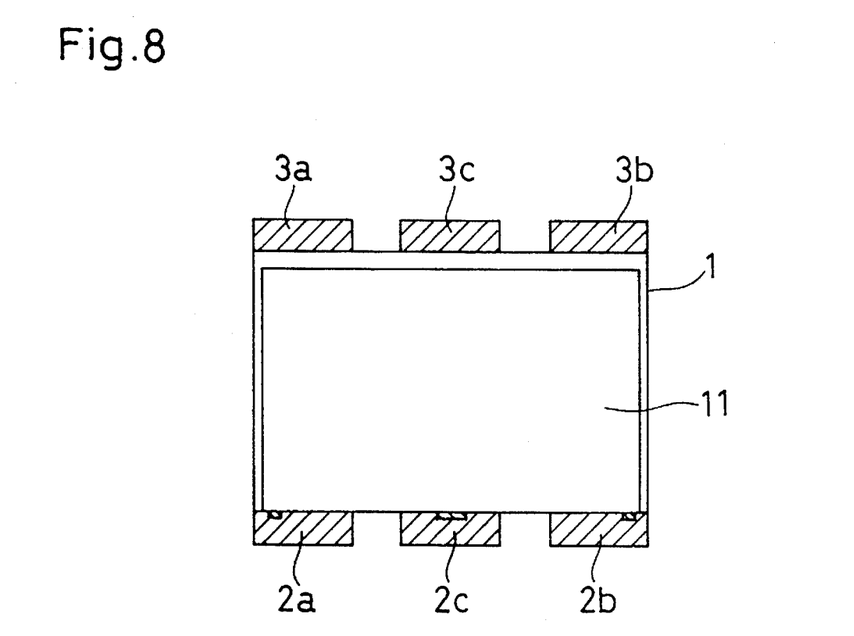
FIG. 8 is a plan view of the insulating substrate on which a second glass coat has been formed on the filter circuit in the first embodiment.

Then, as shown in FIG. 8, a glass paste is printed substantially on the entire area of the upper surface of the insulating substrate 1 excepting the terminal electrodes 2a, 2b and 2c and the dummy terminals 3a, 3b and 3c, and the glass paste is burnt to provide a second glass coat 11 serving as a protecting layer.

Lastly, although not shown, on the bottom surface of the insulating substrate 1 corresponding to the terminal electrodes 2a, 2b and 2c and the dummy electrodes 3a, 3b and 3c and on the end surface of the insulating substrate 1, a conductive paste is printed to connect with the terminal electrodes or the dummy electrodes and the conductive paste is burnt. Thereby, the electrodes are extended to the bottom surface of the insulating substrate 1. The extension of the terminal electrodes 2a, 2b and 2c and the dummy electrodes 3a, 3b and 3c may be made prior to the formation of the bottom electrode 4 of the capacitor and the winding coils 5a and 5b shown in FIG. 4.

The chip filter part made by the above-described process is mounted on a printed circuit board by soldering. At this time, not only the end of the insulating substrate 1 where the terminal electrodes 2a, 2b and 2c are formed but also the end thereof where the dummy electrodes 3a, 3b and 3c are formed are soldered to the printed circuit board. If only the terminal electrode side end is soldered, the dummy electrode side end is separated from the circuit board and the fixing of the filter part may not be sufficient. In this embodiment, since both ends of the insulating substrate 1 are soldered, the chip filter part is prevented from being separated from the printed circuit board and is surely fixed.

In the chip filter part of this embodiment, the terminal electrodes 2a and 2b correspond to the terminals 20a and 20b of the equivalent circuit of FIG. 9, and the terminal electrode 2c corresponds to the terminal 20c. The chip filter of the above-described structure has an inductance sufficient as a filter circuit in the high-frequency band.

Further, the size of the filter part is reduced. The lower limit of the size of a conventional LC filter part for high frequency made by pressing a lead frame into a coil is approximately 3.3 mm long, 4.5 mm wide and 1.8 mm high (thick). According to this embodiment, the size of the chip filter is reduced to approximately 2.5 mm×4.0 mm×1.0 mm.

By reducing the length and the width, the packaging density of the electronic parts on the printed circuit board can be increased, and the degree of freedom of design of the conductive pattern on the printed circuit board increases. Since the length of the conductive pattern can be decreased, unnecessary radiation decreases, so that the stability of the circuit improves. Since the thickness can be decreased, in an apparatus where a plurality of printed circuit boards are arranged in layer, the distance between the printed circuit boards can be decreased, so that the size of the apparatus decreases. Thus, the filter part of this embodiment has an excellent packaging capability.

Figure 10:
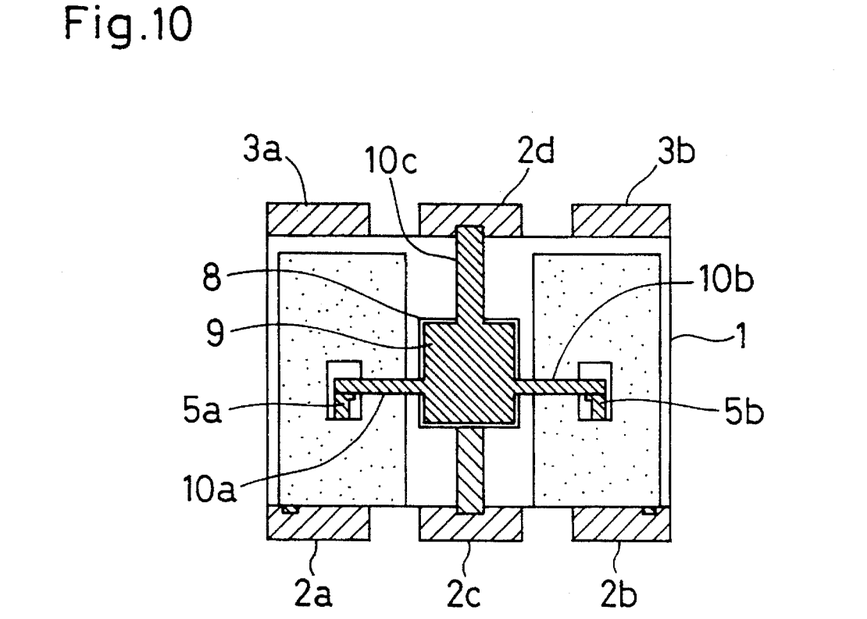
FIG. 10 is a plan view of an insulating substrate on which an upper electrode of a capacitor and connecting conductors have been formed in a chip filter of a second embodiment of the; present invention.

Referring to FIG. 10, there is shown a part of the process of making a chip filter part of a second embodiment of the present invention. In this embodiment, the central dummy terminal 3c of the first embodiment is used as a terminal electrode 2d connected to the upper electrode of the capacitor. The process up to FIG. 6 is performed according to the method of the first embodiment to form the dielectric substance 8 of the capacitor. By printing and burning a conductive paste under this condition, the upper electrode 9 of the capacitor, the connecting conductors 10a and 10b for connecting the capacitor with the winding coils 5a and 5b, and a connecting conductor 10c for connecting the capacitor with the terminal electrode 2d are formed as shown in FIG. 10. The subsequent process is the same as that of the first embodiment.

Figure 11:
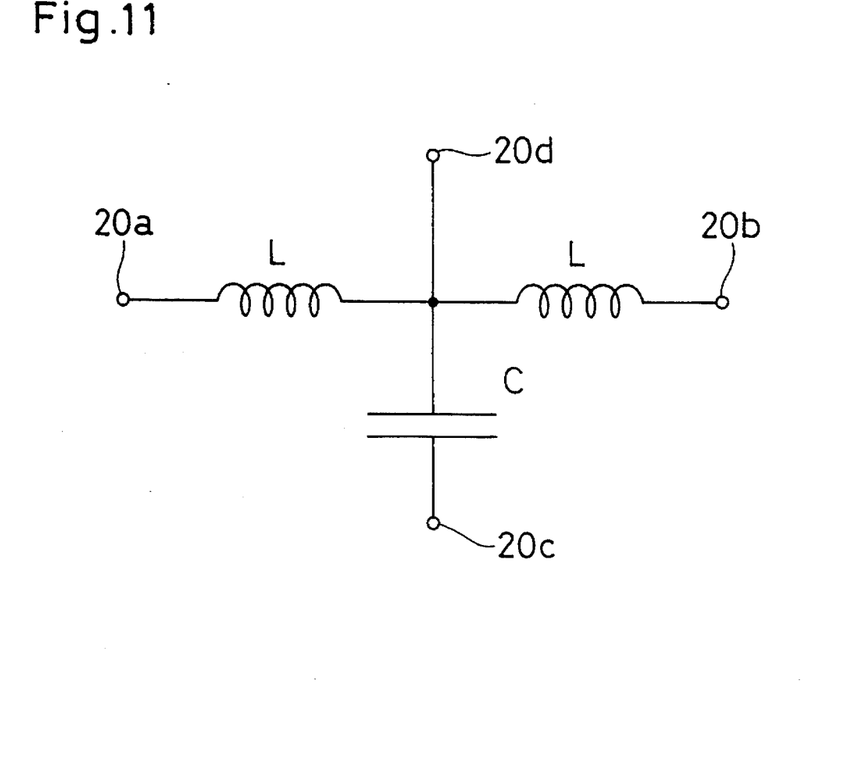
FIG. 11 is a circuit diagram of an equivalent circuit of the filter circuit of the second embodiment.

Referring to FIG. 11, there is shown an equivalent circuit of the chip filter part of this embodiment. A terminal 20d is added to the circuit of FIG. 9, so that the two coils and the capacitor can be directly be connected to other electronic parts. By connecting the terminal 20d to a resistor, the flow of noise into the filter circuit can be reduced.

Figure 12:
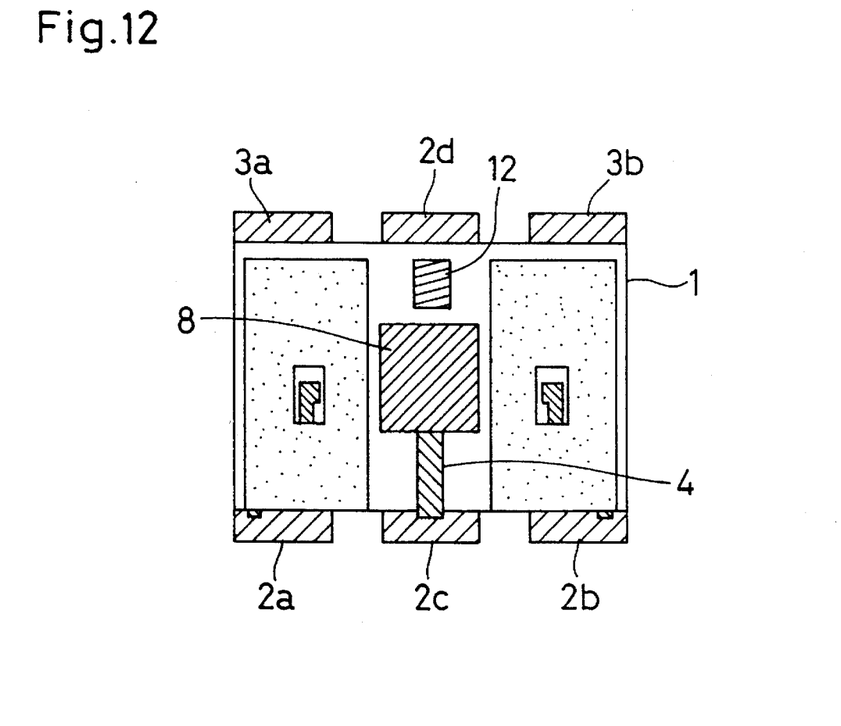
FIG. 12 is a plan view of an insulating substrate on which a resistor has been formed in a chip filter of a third embodiment of the present invention.
Figure 13:
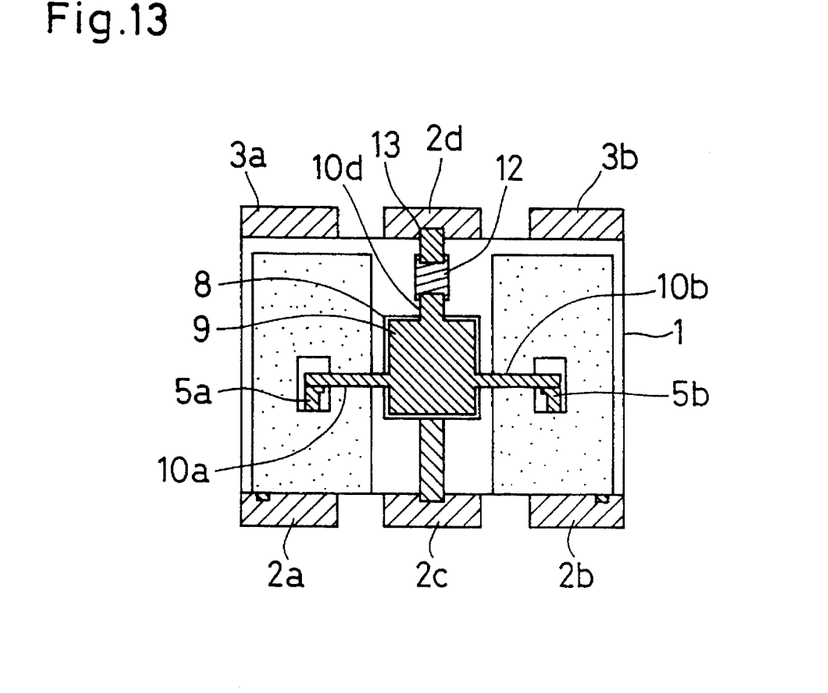
FIG. 13 is a plan view of the insulating substrate on which an upper electrode of a capacitor and connecting conductors have been formed in the third embodiment.

In a chip filter of a third embodiment of the present invention, a resistor connected to the upper electrode of the capacitor is formed on the insulating substrate. The dummy terminal 3c of the first embodiment is used as the terminal electrode of the resistor. A part of its making process is shown in FIGS. 12 and 13. Under a condition where the dielectric substance 8 of the capacitor has been formed according to the method of the first embodiment, as shown in FIG. 12, a paste containing ruthenium oxide is printed between the dielectric substance 8 and the terminal electrode 2d, and the paste is burnt to form a resistor 12. Then, by printing a conductive paste, as shown in FIG. 13, the upper electrode 9 of the capacitor, the connecting conductors 10a and 10b for connecting the capacitor with the winding coils 5a and 5b, a connecting conductor 10d for connecting the capacitor with the resistor 12, and a connecting conductor 13 for connecting the resistor 12 with the terminal electrode 2d are formed. In the subsequent process, like in the first embodiment, the formation of the second glass coat 11 and the extension of the terminal electrodes 2a, 2b, 2c and 2d and the dummy electrodes 3a and 3b to the bottom surface of the insulating substrate 1 of FIG. 8 are performed to complete the chip filter part.

Figure 14:
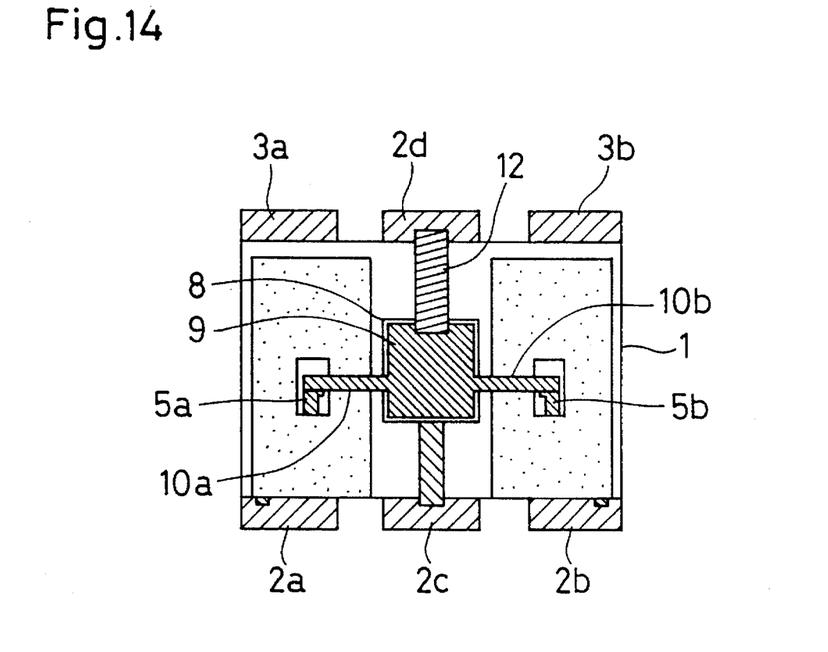
FIG. 14 is a plan view of an insulating substrate on which the resistor of the third embodiment has been formed by another method.

Instead of the above-described method, the chip filter part may be made by the following method: After the upper electrode 9 of the capacitor and the connecting conductors 10a and 10b are formed according to the method of the first embodiment as shown in FIG. 7, as shown in FIG. 14, a paste containing ruthenium oxide is printed to connect the upper electrode 9 with the terminal electrode 2d to form the resistor 12.

Figure 15:
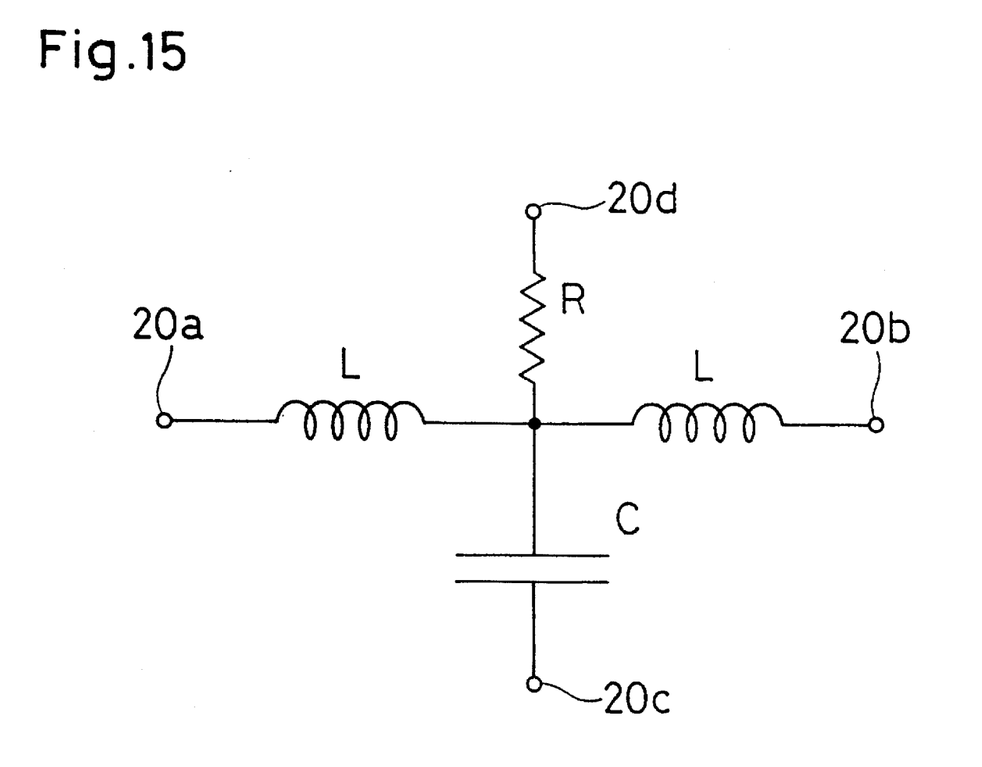
FIG. 15 is a circuit diagram of an equivalent circuit of the filter circuit of the third embodiment.

Referring to FIG. 15, there is shown an equivalent circuit of the chip filter part thus obtained. Since the resistor is provided to directly connect with the capacitor and the two coils, the flow of noise into the filter circuit decreases, so that the stability of the circuit improves.

As described above, the chip filter part of the present invention is made by using the thick film printing including the printing and burning of a paste such as a conductive paste and a dielectric paste. In forming the coils and the patterns of the connecting conductors, a fine processing by the photolithography is possible. Therefore, not only the size of the filter circuit is reduced but also a filter part of a stabile quality is provided. The productivity per unit area remarkably improves compared to the conventional mechanical processing, so that the manufacture cost is reduced.

The capacitance of the capacitor can freely be set by varying the film thickness of the dielectric paste printed at a time or by varying the number of printings while maintaining the film thickness of the paste printed at a time, so that capacitors of various capacitances can readily be made with the same manufacturing apparatus.

Since the inductance of the coil and the capacitance of the capacitor can separately be set, the degree of freedom of design improves in developing the filter part.

Obviously, many modifications and variations of the present invention are possible in light of the above teachings. It is therefore to be understood that within the scope of the appended claims, the invention may be practiced other than as specifically described.

What is claimed is:

1. A chip filter for high frequency comprising:
    a capacitor and two substantially winding coils formed on a top surface of an insulating substrate said insulating substrate having a plurality of recesses at an end, thereof three terminal electrodes are provided on the top surface of the insulating substrate at portions adjacent to the recesses, said terminal electrodes extending to a bottom surface of the insulating substrate along a side surface thereof, one end of each of the two coils and a first electrode of the capacitor are connected to different terminal electrodes, and the other end of each of the two coils is connected to a second electrode of the capacitor.

2. A chip filter for high frequency according to claim 1, wherein a resistor is formed on the insulating substrate printing, and wherein a fourth terminal electrode, extending to the bottom surface along a side surface, is provided on the top surface of the insulating substrate and the resistor is connected to the second electrode of the capacitor and to the fourth terminal electrode.

3. A chip filter for high frequency according to claim 1, wherein the terminal electrodes are provided at one end of the insulating substrate and a dummy electrode is provided on a side surface of the insulating substrate at another end opposite to the end at which the terminal electrodes are provided.

4. A chip filter comprising:
    an insulating substrate having a plurality of recesses at one end thereof;
    a first terminal electrode, a second terminal electrode and a third terminal electrode formed on a top surface of the insulating substrate at portions adjacent to the recesses, said first, second and third terminal electrodes extending to a bottom surface of the insulating substrate along a side surface thereof;
    a first coil formed by a conductor in a winding on the top surface of the insulating substrate, an external end of the winding being connected to the first terminal electrode;
    a second coil formed by a conductor in a winding on the top surface of the insulating substrate, an external end of the winding being connected to the second terminal electrode;
    a capacitor formed by successively forming a first electrode, a dielectric substance and a second electrode on the top surface of the insulating substrate, said first electrode being connected to the third terminal electrode;

an insulating member formed to cover the first and second coils, said insulating member having a window at which an inner end of the winding of the first coil is exposed and a window at which an inner end of the winding of the second coil is exposed; and a connecting conductor formed on the insulating substrate so as to connect the inner end of the winding of the first coil and the inner end of the winding of the second coil with the second electrode of the capacitor.

5. A chip filter according to claim 4, wherein said insulating member is a glass coat formed by printing.

* * * * *